United States Patent
Chaurasia (10) Patent No.: US 12,119,070 B2
(45) Date of Patent: Oct. 15, 2024

(54) MEMORY FAILURE PREDICTION

(71) Applicant: Micron Technology, Inc., Boise, ID (US)

(72) Inventor: Abhishek Chaurasia, Bellevue, WA (US)

(73) Assignee: Micron Technology, Inc., Boise, ID (US)

( * ) Notice: Subject to any disclaimer, the term of this patent is extended or adjusted under 35 U.S.C. 154(b) by 105 days.

(21) Appl. No.: 17/727,587

(22) Filed: Apr. 22, 2022

(65) Prior Publication Data

US 2022/0359029 A1 Nov. 10, 2022

Related U.S. Application Data (60) Provisional application No. 63/185,275, filed on May 6, 2021.

(51) Int. Cl.
*G06F 11/00* (2006.01)
*G06N 3/08* (2023.01)
*G11C 29/08* (2006.01)

(52) U.S. Cl.
CPC ............... *G11C 29/08* (2013.01); *G06N 3/08* (2013.01)

(58) Field of Classification Search
CPC ........ G06T 7/0004; G06T 2207/10016; G11B 20/1816
See application file for complete search history.

(56) References Cited

U.S. PATENT DOCUMENTS

| | | | | |
|---|---|---|---|---|
| 8,121,395 B2* | 2/2012 | Hiroi | ....................... | G06T 7/001 |
| | | | | 382/145 |
| 8,836,780 B2* | 9/2014 | Weiss | ...................... | H01L 22/12 |
| | | | | 348/86 |
| 2004/0103353 A1* | 5/2004 | Koyama | .............. | G01R 31/311 |
| | | | | 714/724 |
| 2011/0082650 A1* | 4/2011 | Leu | .......................... | G06T 7/001 |
| | | | | 702/81 |
| 2015/0294455 A1* | 10/2015 | Lee | ......................... | H01L 22/20 |
| | | | | 382/112 |
| 2019/0130552 A1* | 5/2019 | Sohn | ..................... | G03F 7/7065 |

(Continued)

OTHER PUBLICATIONS

Bianca Schroeder, Eduardo Pinheiro, Wolf-Dietrich Weber, "DRAM Errors in the Wild: A Large-Scale Field Study", SIGMETRICS/Performance'09, Jun. 15-19, 2009, Seattle, WA, USA.

(Continued)

*Primary Examiner* — Amine Riad
(74) *Attorney, Agent, or Firm* — Greenberg Traurig (57) ABSTRACT

A system, method and apparatus of memory failure prediction through image analyses using an artificial neural network. A sequence of images indicative of progress of memory failures in a region of an integrated circuit die can be generated according to a physical layout of memory cells in the region. The artificial neural network can be trained to recognize graphical features in early images in the sequence and to predict, based on the recognized graphical features, memory failures shown in subsequent images in the sequence. A computing apparatus can use the artificial neural network to analyze an input image shown current memory failures in the region and to identify one or more memory cells in the region that are likely to have subsequent memory failures.

20 Claims, 5 Drawing Sheets

(56) References Cited

U.S. PATENT DOCUMENTS

2019/0306328 A1* 10/2019 Kodama ............ H04N 1/00045
2020/0034693 A1*  1/2020 Huh ................... H01L 22/20
2020/0388020 A1* 12/2020 Chen .................. H01L 22/20
2021/0241048 A1*  8/2021 Rezaei ............... G06V 10/774
2022/0245801 A1*  8/2022 Gietzen ............. G06V 10/774

OTHER PUBLICATIONS

Taniya Siddiqua, Athanasios E. Papathanasiou, Arijit Biswas, Sudhanva Gurumurthi, "Analysis and Modeling of Memory Errors from Large-scale Field Data Collection", IEEE Workshop on Silicon Errors in Logic—System Effects, Mar. 2013.

Xiaoming Du, Cong Li, "Memory Failure Prediction Using Online Learning", MEMSYS, Oct. 1-4, 2018, Old Town Alexandria, VA, USA.

* cited by examiner

MEMORY FAILURE PREDICTION

RELATED APPLICATIONS

The present application claims priority to Prov. U.S. Pat. App. Ser. No. 63/185,275 filed May 6, 2021, the entire disclosures of which application are hereby incorporated herein by reference.

TECHNICAL FIELD

At least some embodiments disclosed herein relate to predictions of memory failures in general, and more particularly, but not limited to predictions using an Artificial Neural Network (ANN).

BACKGROUND

An Artificial Neural Network (ANN) uses a network of neurons to process inputs to the network and to generate outputs from the network.

Deep learning has been applied to many application fields, such as computer vision, speech/audio recognition, natural language processing, machine translation, bioinformatics, drug design, medical image processing, games, etc.

BRIEF DESCRIPTION OF THE DRAWINGS

The embodiments are illustrated by way of example and not limitation in the figures of the accompanying drawings in which like references indicate similar elements.

DETAILED DESCRIPTION

At least some aspects of the present disclosure are directed to memory failure prediction through image analyses performed using artificial neural networks.

An integrated circuit memory device can have one or more integrated circuit dies on which memory cells are formed. A memory cell manufactured on an integrated circuit die can be programmed to store data by the way of its state at a voltage applied across the memory cell.

For example, if a memory cell is configured or programmed in such a state that allows a substantial current to pass the memory cell at a voltage in a predefined voltage region, the memory cell is considered to have been configured or programmed to store a first bit value (e.g., one or zero); and otherwise, the memory cell is storing a second bit value (e.g., zero or one).

Optionally, some types of memory cells can be configured or programmed to store more than one bit of data by being configured or programmed to have a threshold voltage in one of more than two separate voltage regions. The threshold voltage of a memory cell is such that when the voltage applied across the memory cell is increased to above the threshold voltage, the memory cell changes rapidly or abruptly, snaps, or jumps from a non-conductive state to a conductive state. The non-conductive state allows a small leak current to go through the memory cell; and in contrast, the conductive state allows more than a threshold amount of current to go through. Thus, a memory device can use a sensor to detect the change, or determine the conductive/non-conductive state of the memory device at one or more applied voltages, to evaluate or classify the level of the threshold voltage of the memory cell and thus its stored data.

The threshold voltage of a memory cell being configured/programmed to be in different voltage regions can be used to represent different data values stored in the memory cell. For example, the threshold voltage of the memory cell can be programmed to be in any of four predefined voltage regions; and each of the regions can be used to represent the bit values of a different two-bit data item. Thus, when given a two-bit data item, one of the four voltage regions can be selected based on a mapping between two-bit data items and voltage regions; and the threshold voltage of the memory cell can be adjusted, programmed, or configured to be in the selected voltage region to represent or store the given two-bit data item. To retrieve, determine, or read the data item from the memory cell, one or more read voltages can be applied across the memory cell to determine which of the four voltage regions contain the threshold voltage of the memory cell. The identification of the voltage region that contains the threshold voltage of the memory cell provides the two-bit data item that has been stored, programmed, or written into the memory cell.

For example, a memory cell of the type of flash memory or cross point memory can be configured or programmed to store a one-bit data item in a Single Level Cell (SLC) mode, or a two-bit data item in a Multi-Level Cell (MLC) mode, or a three-bit data item in a Triple Level Cell (TLC) mode, or a four-bit data item in Quad-Level Cell (QLC) mode, or a five-bit data item in a Penta-Level Cell (PLC) mode.

The threshold voltage of a memory cell can change or drift over a period of time, usage, and/or read operations, and in response to certain environmental factors, such as temperate changes. The rate of change or drift can increase as the memory cell ages. The change or drift can result in errors in determining, retrieving, or reading the data item back from the memory cell.

Some memory cells store electric charges to have states representative data stored in the memory cells. Charge leak can lead to state changes and thus error in reading the memory cells.

Random errors in reading memory cells can be detected and corrected using redundant information. Data to be stored into memory cells can be encoded to include redundant information to facilitate error detection and recovery. When data encoded with redundant information is stored in a memory sub-system, the memory sub-system can detect errors in data represented by the voltage regions of the threshold voltages of the memory cells and/or recover the original data that is used to generate the data used to program the threshold voltages of the memory cells. The recovery operation can be successful (or have a high probability of success) when the data represented by the threshold voltages of the memory cells and thus retrieved directly from the memory cells in the memory sub-system contains fewer errors, or the bit error rate in the retrieved data is low and/or when the amount of redundant information is high. For example, error detection and data recovery can be performed using techniques such as Error Correction Code (ECC), Low-Density Parity-Check (LDPC) code, etc. However, the recovery operation can fail (or have a high probability of failure) when the bit error rate is high and/or when the amount of redundant information is insufficient.

At least some aspects of the present disclosure address the above and other deficiencies and/or challenges by generating images representative of health and usage of memory cells in a memory device and perform memory failure predictions using image analyses techniques implemented using artificial neural networks.

For example, spatial correlations in failures in reading memory cells can have a pattern visible in an image representative of the statuses of the memory cells formed on an integrated circuit die. The failures in a local region on the integrated circuit die can grow over a period of time to exceed the error recover capability of an Error Correction Code (ECC). The failure growth can be visualized in images and analyzed via artificial neural networks (e.g., using computer vision techniques) to make predictions of subsequent memory failures. When the progress of failures can be predicted from observing small numbers of recoverable errors, preemptive measures can be scheduled and deployed to avoid unrecoverable errors.

Figure 1:
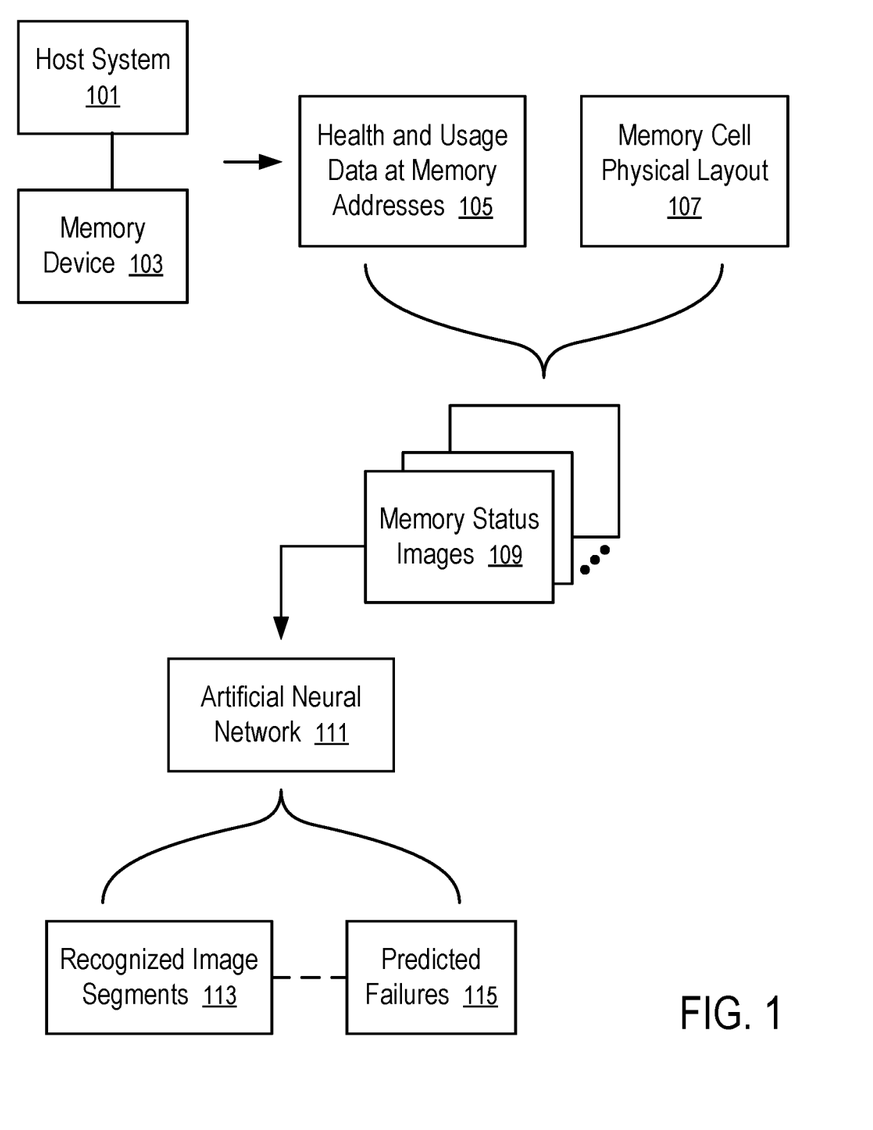
FIG. 1 illustrates a technique to predict memory failures via image analyses by an Artificial Neural Network (ANN) according to one embodiment.

FIG. 1 illustrates a technique to predict memory failures via image analyses by an Artificial Neural Network (ANN) according to one embodiment.

In FIG. 1, a computing system has a host system 101 and a memory device 103. The host system 101 can send commands to access the memory device 103, such as commands to write data into the memory device 103, commands to read data from the memory device 103, commands to erase data from the memory device 103, etc.

The memory device 103 can have memory cells formed on an integrated circuit die. A memory cell physical layout 107 specifies where memory cells are individually disposed on the integrated circuit die in the memory device 103. Optionally, the memory cell physical layout 107 can further identify, in the integrated circuit die, structures, elements, or features that can be relevant to memory failures, such as the locations of voltage drivers configured to apply voltages to the memory cells, wires connecting from the voltage drivers to the memory cells, etc.

During operations of the computing system, the host system 101 can generate health and usage data 105 for memory cells at various memory addresses. For example, the health and usage data 105 can indicate when a memory failure occurs at a memory cell identified by a memory address. For example, the health and usage data 105 can identify the time a memory cell is last refreshed or written. For example, the health and usage data 105 can identify an age of a memory cell in terms of program/erasure cycles the memory cell has experience.

Memory status images 109 can be generated from the health and usage data 105 and the memory cell physical layout 107. For example, in an image 109 corresponding to the memory cell physical layout 107, regions or locations representative of memory cells in the physical layout 107 can be annotated via colors and/or shapes to identify the health and usage data 105 of the memory cells at a time instance.

For example, a memory cell can be shown in a memory status image 109 at a location corresponding to its physical location in a page, block, array, deck or region of memory cells on an integrated circuit die.

For example, the memory cell can be shown as a pixel, or a set of pixels, in the memory status image 109.

For example, whether a read error occurs in the memory cell can be represented by a color of the one or more pixels representative of the memory cell.

For example, usage data relevant to the prediction of memory failure (e.g., read errors, write errors) can be painted as background colors in relevant regions or presented as symbols or shapes in relevant locations on the memory status image 109. For example, the time to the last write to a region of memory cells, the age of memory cells in the region, etc. can be graphically represented in the memory status images 109.

The memory status images 109 show in a graphical way the progress of memory failures over time in various locations on an integrated circuit die. The graphical representation of the health and usage data 105 on the memory cell physical layout 107 in the form of memory status images 109 can be visually inspected to discover patterns to make predictions.

In FIG. 1, an artificial neural network 111 is trained using a machine learning technique. For example, techniques of computer vision, image segmentation, and image pattern recognition can be applied to the memory status images 109 to identify recognized image segments 113 having patterns of memory failure progress, and predicted failures 115. The machine learning technique reduces the differences between the predicted failures 115 and the memory failures identified in the health and usage data 105 and reflected in the corresponding graphical features in the memory status images 109.

For example, a pattern of memory failures progressing from a few early errors to subsequent errors in a local area in the memory status images 109 can be recognized by the artificial neural network 111 and use to train the predictions of the subsequent errors. Subsequently, when a pattern of the early errors is found in another local area is identified by the artificial neural network 111, the artificial neural network 111 can predict subsequent errors that have observed and thus trained from similar subsequent errors in other areas.

FIGS. 2-5 illustrate memory status images for memory failure prediction according to some embodiments. For example, the images illustrated in FIGS. 2-5 can be used in the implementation of the technique of FIG. 1.

Figure 2:
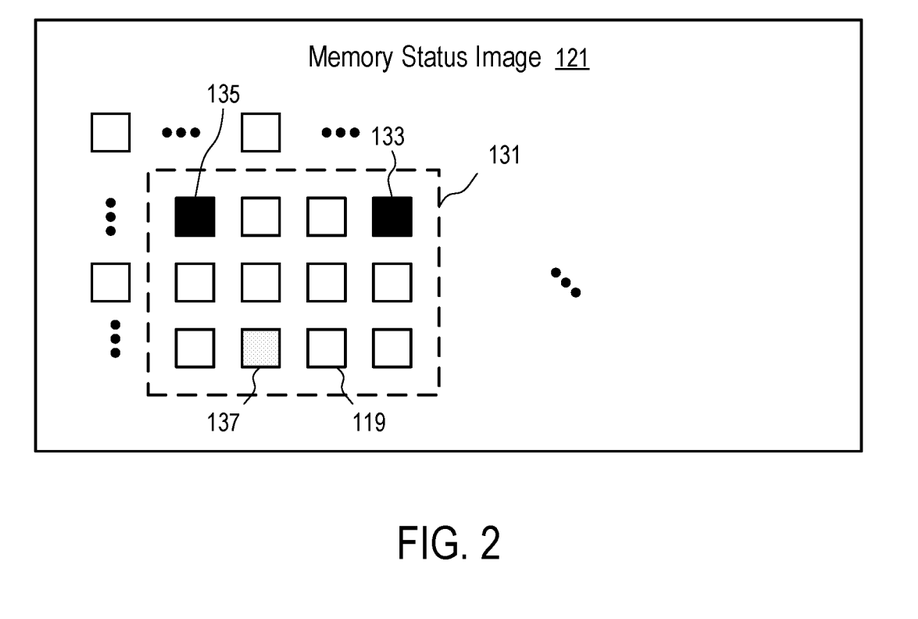
FIGS. 2-5 illustrate memory status images for memory failure prediction according to some embodiments.

FIG. 2 shows a memory status image 121 in which a typical memory cell 119 on an integrated circuit die is shown in the memory status image 121 at a location according to its layout on the integrated circuit die. Thus, the spatial relations among memory cells in the memory status image 121 are representative of the spatial relations of the corresponding memory cells on the integrated circuit die.

Memory cells (e.g., 133 and 135) that have memory failures (e.g., read errors) are presented in the memory status image 121 in a way visually different from other memory cells (e.g., 137) that have no memory failures yet.

Figure 3:
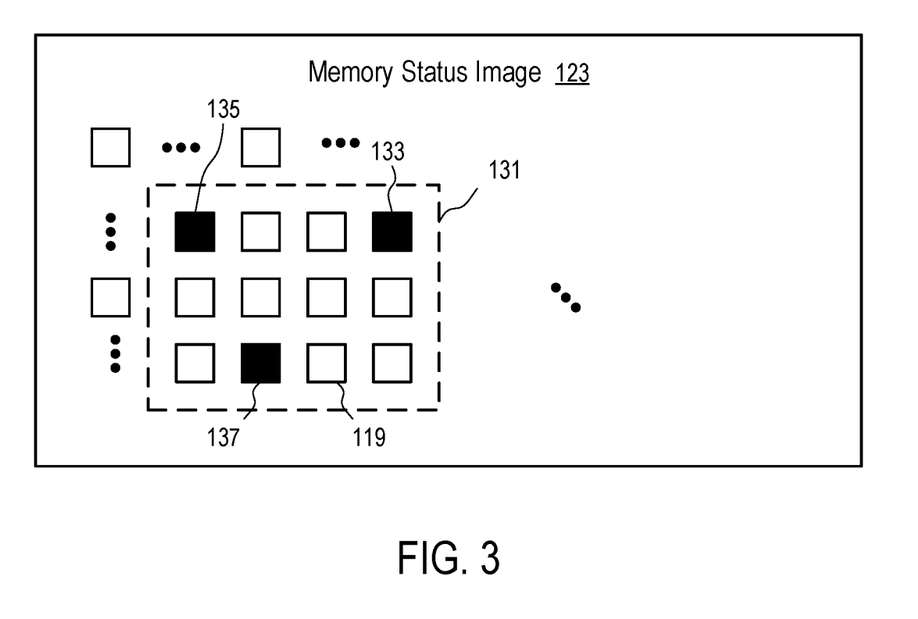

FIG. 3 shows a subsequent memory status image 123 that has a new memory failure at a memory cell 137 near the cluster of memory errors at memory cells 133 and 135 seen in an earlier memory status image 121 illustrated in FIG. 2.

When memory failures grow in a local area on the integrated circuit die, a graphical feature of an image segment 131 is identifiable in the memory status images 121 and 123.

The artificial neural network 111 can be trained to identify a recognized image segment 131 (e.g., using image segmentation techniques in computer vision and/or image processing).

Further, the artificial neural network 111 is trained to predict, based on the graphical image feature in the image segment 131, the subsequent error in the memory cell 137.

FIGS. 2 and 3 illustrate an example of the graphical representation of the progress of memory failures in a memory region represented by the image segment 131. In general, the health and usage data 105 from a computing system provides a number of observed scenarios, which can be used to train the artificial neural network 111 to recognize image segments 113 and make predictions of failures 115 in a way consistent with the observed failure scenarios identified in the health and usage data 105.

Figure 4:
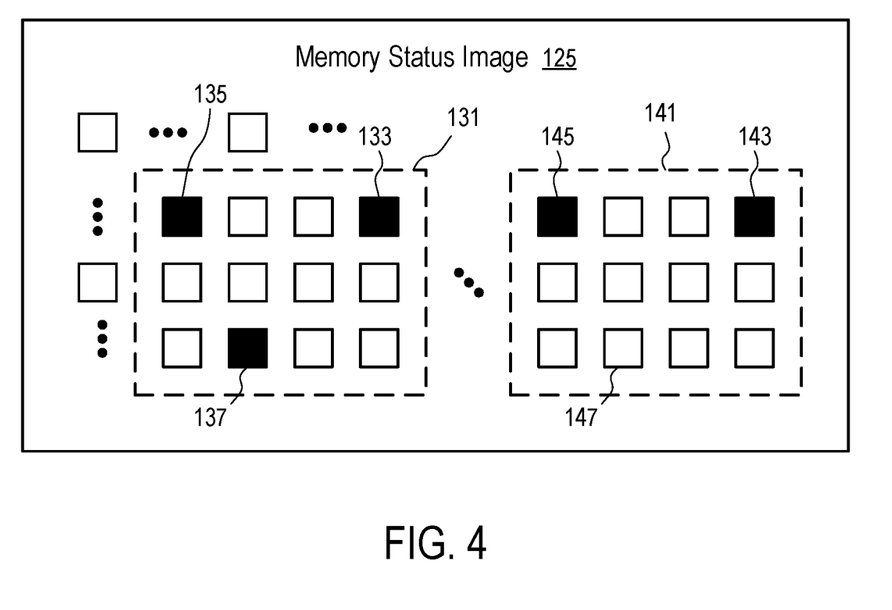

FIG. 4 illustrates an example of the application of the predication capability of the artificial neural network 111. In FIG. 4, the artificial neural network 111 recognizes an image segment 141 that has a similar pattern of graphical features as in the image segment 131 in FIG. 2. Since the previously processed memory status image 123 in FIG. 3 trains the artificial neural network 111 to predict the memory failure in the memory cell 137 in the image segment 131, the artificial neural network 111 can predict that in the image segment 141 it is likely to have a memory failure in a memory cell 147. Such a prediction can be used by the host system 101 to take actions to prevent data loss and/or interruption. For example, the host system 101 can generate commands to refresh the data in the memory region corresponding to the image segment 141. For example, the host system 101 can generate commands to create a redundant copy of the data in the memory region corresponding to the image segment 141. For example, the host system 101 can generate commands to move the data from the memory region corresponding to the image segment 141 to another memory region.

In one implementation, each memory cell (e.g., 133, 135) having memory failure is represented by a pixel having a predetermined color (e.g., black). The spatial relations among the pixels are proportional to the distances among the corresponding memory cells in an integrated circuit die. Further, pixels having other colors can be used to represent the usage statuses of corresponding memory cells that have no memory failure. For example, a gray of a level of brightness can be used to indicate the lapsed time from last write, the age of the memory cell, the number of erasure operations applied to the memory cell, or another parameter relevant to the prediction of memory failures. For example, red, green and blue channels of the color of a pixel can be used to represent three health and/or usage parameters of a memory cell.

In another implementation, each memory cell (e.g., 119) is represented by a set of pixels having a shape (e.g., square or circle). The health and usage data 105 of the memory cell (e.g., 119) can be presented via the shape and/or color of at least some of the pixels representative of the memory cell (e.g., 119).

Figure 5:
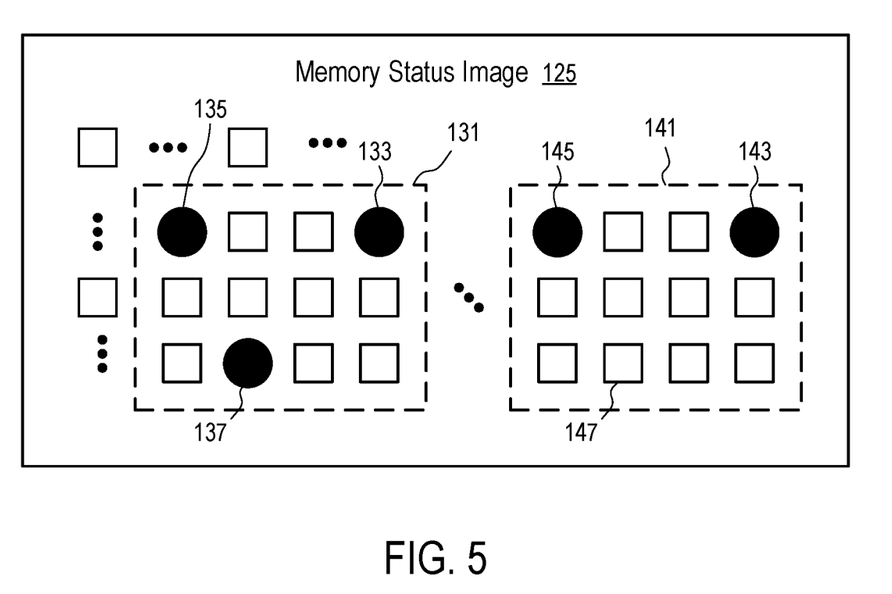

FIG. 5 illustrates a memory status image 125 where memory cells (e.g., 133, 135, 137, 143, 145) having memory failures are represented using a shape (e.g., circle) having a color (e.g., black), while memory cells (e.g., 147) having no memory failures are represented using another shape (e.g., square) having a different color (e.g., white).

The shapes representative of the memory cells can be overlaid on a region of a background color that represents one or more parameters common to the memory cells in the region.

Further, some features or parameters of memory cells as specified in the physical layout 107 can be shown on the memory status images 109. For example, electrical distances to voltage drivers can be presented via background colors of memory cells.

When the health and usage data 105 and the memory physical layout 107 are presented visually in the memory status images 109, the artificial neural network 111 can be used to learn patterns in development of memory failures in local memory regions and predict failures 115.

Figure 6:
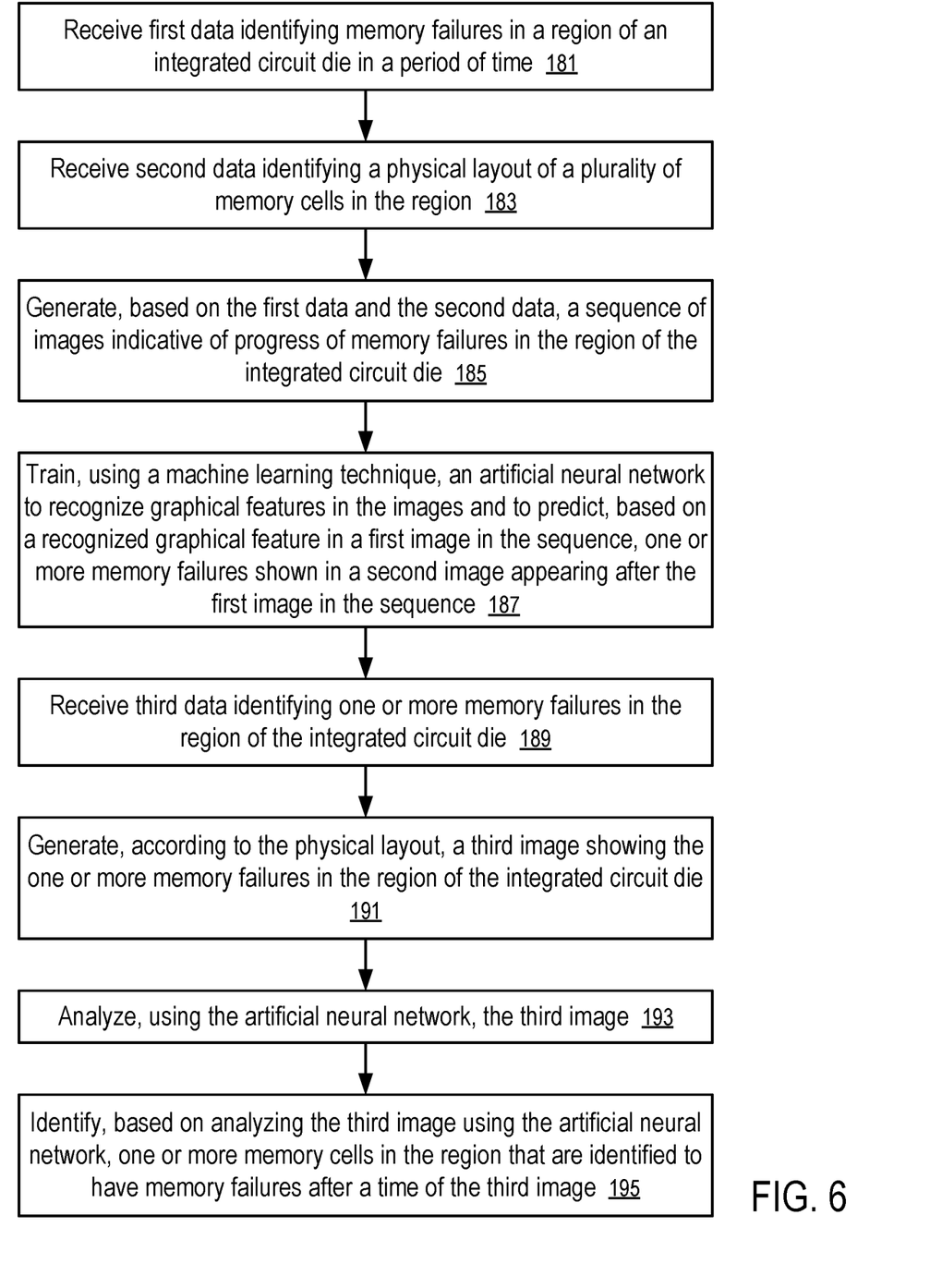
FIG. 6 shows a method of memory failure prediction according to one embodiment.

FIG. 6 shows a method of memory failure prediction according to one embodiment. For example, the operations of FIG. 6 can be implemented using the technique of FIG. 1 with memory status images illustrated in FIGS. 2 to 5.

At block 181, a computing apparatus receives first data identifying memory failures in a region of an integrated circuit die in a period of time.

For example, the first data can be provided by a computing device having a host system 101 and a memory device 103 that has memory cells form on the integrated circuit die during the usage of the memory device 103. The first data can include health and usage data 105 about memory cells at memory addresses used by the host system 101 and/or the memory device 103.

The computing device having the host system 101 and the memory device 103 can be part of the computing apparatus in one implementation. In another implementation, the computing apparatus operates independently from the computing device having host system 101. For example, the computing apparatus can receive the first data from the computing device via a wired or wireless computer connection. For example, the computing apparatus can be a server computer connected to the host system 101.

At block 183, the computing apparatus receive second data identifying a physical layout 107 of a plurality of memory cells in the region of the integrated circuit die.

At block 185, the computing apparatus generates, based on the first data and the second data, a sequence of images 109 indicative of progress of memory failures in the region of the integrated circuit die.

For example, pixels representative of the plurality of memory cells in the region can be configured to be at locations in the images 109 corresponding to the locations of the plurality of memory cells in the region of the integrated circuit die. Thus, the spatial relations among the memory cells are represented by the spatial relations among groups of pixels representing the respective memory cells.

At block 187, the computing apparatus trains, using a machine learning technique, an artificial neural network 111 to recognize graphical features in the images and to predict, based on a recognized graphical feature in a first image 121 in the sequence, one or more memory failures shown in a second image 123 appearing after the first image in the sequence.

For example, each respective memory cell having a memory failure in the region is represented by at least one pixel in the first image at a location corresponding to a location of the respective memory cell in the region on the integrated circuit die.

For example, the respective memory cell having a memory failure can be represented, in the first image 121, by a plurality of pixels having a predefined shape. The shape can be the same or different from a shape of pixels representative of a memory cell having no memory failure.

For example, the plurality of pixels representative of the respective memory cell having a memory failure in the first image can have a predefined color different from one or more colors of pixels representative of memory cells having no memory failures.

Optionally, the first image 121 can include pixels representative of structural features associated with the plurality of memory cells in the region, such as electrical distance from the memory cells to their drives.

Optionally, the first image 121 can include pixels having attributes representative of data indicative of usages of the plurality of memory cells in the region, such as time from last write/refresh operations, age of the memory cells, etc.

For example, the artificial neural network 111 can be configured to perform image segmentation to identify a portion of the first image 131 (e.g., image segment 131) to recognize a graphical feature in the portion. Thus, the development of a pattern of graphical features in a local region of the memory status image 121 can be recognized and used to train the artificial neural network 111 to make predictions in other local regions of the memory status image 121.

At block 189, the computing apparatus receives third data identifying one or more memory failures in the region of the integrated circuit die.

At block 191, the computing apparatus generates, according to the physical layout 107, a third image 125 showing the one or more memory failures in the region of the integrated circuit die.

At block 193, the computing apparatus analyzes, using the artificial neural network 111, the third image 125.

At block 195, the computing apparatus identifies/predicts, based on analyzing the third image 125 using the artificial neural network 111, one or more memory cells (e.g., 147) in the region that are identified to have memory failures after a time of the third image 125.

The identified/predicted memory failures in the one or more memory cells (e.g., 147) can cause the computing apparatus and/or the host system 101 to determine whether to perform operations to avoid data loss and/or interruption. For example, a data refreshing operation can be performed in the region of the integrated circuit die in response to the one or more memory cells being identified to have memory failures. For example, a redundant copy of data in the region can be stored in response to the one or more memory cells being identified to have memory failures. For example, the data in region can be moved to a different region in response to the one or more memory cells being identified to have memory failures.

Figure 7:
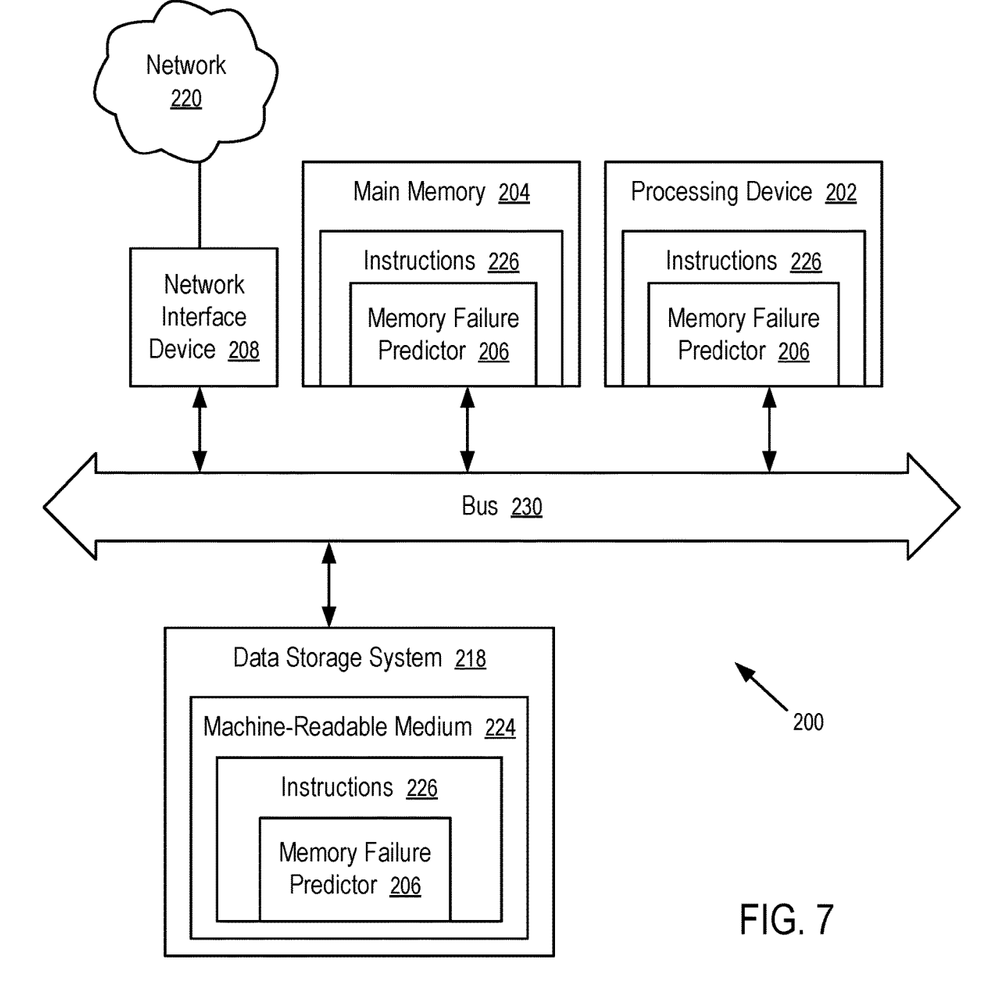
FIG. 7 is a block diagram of an example computer system in which embodiments of the present disclosure can operate.

FIG. 7 illustrates an example machine of a computer system 200 within which a set of instructions, for causing the machine to perform any one or more of the methodologies discussed herein, can be executed. In some embodiments, the computer system 200 can correspond to a host system that includes, is coupled to, or utilizes a memory sub-system or can be used to perform the operations of a memory failure predictor 206 (e.g., to execute instructions to perform operations corresponding to memory failure prediction described with reference to FIGS. 1-6). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a server, a personal computer (PC), a tablet PC, a set-top box (STB), a Personal Digital Assistant (PDA), a cellular telephone, a web appliance, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 200 includes a processing device 202, a main memory 204 (e.g., read-only memory (ROM), flash memory, dynamic random access memory (DRAM) such as synchronous DRAM (SDRAM) or Rambus DRAM (RDRAM), static random access memory (SRAM), etc.), and a data storage system 218, which communicate with each other via a bus 230 (which can include multiple buses).

Processing device 202 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 202 can also be one or more special-purpose processing devices such as an application specific integrated circuit (ASIC), a field programmable gate array (FPGA), a digital signal processor (DSP), network processor, or the like. The processing device 202 is configured to execute instructions 226 for performing the operations and steps discussed herein. The computer system 200 can further include a network interface device 208 to communicate over the network 220.

The data storage system 218 can include a machine-readable medium 224 (also known as a computer-readable medium) on which is stored one or more sets of instructions 226 or software embodying any one or more of the methodologies or functions described herein. The instructions 226 can also reside, completely or at least partially, within the main memory 204 and/or within the processing device 202 during execution thereof by the computer system 200, the main memory 204 and the processing device 202 also constituting machine-readable storage media. The machine-readable medium 224, data storage system 218, and/or main memory 204 can correspond to a memory sub-system.

In one embodiment, the instructions 226 include instructions to implement functionality corresponding to a memory failure predictor 206 (e.g., operations of memory failure prediction described with reference to FIGS. 1-6). While the machine-readable medium 224 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

In this description, various functions and operations are described as being performed by or caused by computer instructions to simplify description. However, those skilled in the art will recognize what is meant by such expressions is that the functions result from execution of the computer instructions by one or more controllers or processors, such as a microprocessor. Alternatively, or in combination, the functions and operations can be implemented using special purpose circuitry, with or without software instructions, such as using Application-Specific Integrated Circuit (ASIC) or Field-Programmable Gate Array (FPGA). Embodiments can be implemented using hardwired circuitry without software instructions, or in combination with software instructions. Thus, the techniques are limited neither to any specific combination of hardware circuitry and software, nor to any particular source for the instructions executed by the data processing system.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A method, comprising:
    generating, in a computing apparatus and according to a physical layout of a plurality of memory cells in a region of an integrated circuit die, a sequence of images indicative of progress of memory failures in the region of the integrated circuit die, wherein a first image in the sequence images is indicative of a first memory cell of the plurality of memory cells not having failed and wherein a second image in the sequence of images is indicative of the first memory cell having failed;
    training, in the computing apparatus using a machine learning technique, an artificial neural network to recognize graphical features in the images and to predict, based on a recognized graphical feature in the first image in the sequence, one or more memory failures shown in the second image appearing after the first image in the sequence;
    receiving, in the computing apparatus, a third image indicative of one or more memory failures in the region of the integrated circuit die;
    analyzing, by the computing apparatus using the artificial neural network, the third image; and
    identifying, based on the analyzing, one or more memory cells in the region, the one or more memory cells identified to have memory failures after a time of the third image.

2. The method of claim 1, wherein each respective memory cell having a memory failure in the region is represented by at least one pixel in the first image at a location corresponding to a location of the respective memory cell in the region on the integrated circuit die.

3. The method of claim 2, wherein the respective memory cell is represented, in the first image, by a plurality of pixels having a predefined shape.

4. The method of claim 3, wherein the plurality of pixels representative of the respective memory cell in the first image have a predefined color different from colors of pixels representative of memory cells having no memory failures.

5. The method of claim 4, wherein the first image includes pixels representative of structural features associated with the plurality of memory cells in the region.

6. The method of claim 4, wherein the first image includes pixels having attributes representative of data indicative of usages of the plurality of memory cells in the region.

7. The method of claim 4, wherein the artificial neural network is configured to perform image segmentation to identify a portion of the first image to identify a graphical feature in the portion.

8. The method of claim 4, further comprising:
    performing a data refreshing operation in the region in response to the one or more memory cells being identified to have memory failures.

9. The method of claim 4, further comprising:
    storing a redundant copy of data in the region in response to the one or more memory cells being identified to have memory failures.

10. The method of claim 4, further comprising:
moving data from the region to a different region in response to the one or more memory cells being identified to have memory failures.

11. An apparatus, comprising:
memory storing instructions; and
at least one processor configured via the instructions to:
receive a sequence of images generated according to a physical layout of a plurality of memory cells in a region of an integrated circuit die to show progress of memory failures in the region of the integrated circuit die, wherein a first image in the sequence images is indicative of a first memory cell of the plurality of memory cells not having failed and wherein a second image in the sequence of images is indicative of the first memory cell having failed;
train, using a machine learning technique, an artificial neural network to recognize graphical features in the images and to predict, based on a recognized graphical feature in the first image in the sequence, one or more memory failures shown in the second image appearing after the first image in the sequence;
receive a third image indicative of one or more memory failures in the region of the integrated circuit die; and
identify, based on an analysis of the third image using the artificial neural network, one or more memory cells in the region, the one or more memory cells identified to have memory failures after a time of the third image.

12. The apparatus of claim 11, wherein each respective memory cell having a memory failure in the region is represented by at least one pixel in a respective image in the sequence at a location corresponding to a location of the respective memory cell in the region on the integrated circuit die.

13. The apparatus of claim 12, wherein the respective memory cell is represented, in the respective image, by a plurality of pixels having a shape different from a shape representative of a memory cell having no memory failure.

14. The apparatus of claim 13, wherein the plurality of pixels representative of the memory cell in the respective image have a predefined color different from one or more colors of pixels representative of memory cells having no memory failures.

15. The apparatus of claim 14, wherein the first image includes pixels representative of structural features associated with the plurality of memory cells in the region.

16. The apparatus of claim 14, wherein the first image includes pixels having attributes representative of data indicative of usages of the plurality of memory cells in the region.

17. The apparatus of claim 14, wherein the artificial neural network is configured to perform image segmentation to identify a portion of the first image to identify a graphical feature in the portion.

18. A non-transitory computer readable storage medium storing instructions which, when executed by a microprocessor in a computing device, causes the computing device to perform a method, comprising:
receiving first data identifying memory failures in a region of an integrated circuit die in a period of time;
receiving second data identifying a physical layout of a plurality of memory cells in the region;
generating, based on the first data and the second data, a sequence of images indicative of progress of memory failures in the region of the integrated circuit die, wherein a first image in the sequence images is indicative of a first memory cell of the plurality of memory cells not having failed and wherein a second image in the sequence of images is indicative of the first memory cell having failed;
training, using a machine learning technique, an artificial neural network to recognize graphical features in the images and to predict, based on a recognized graphical feature in the first image in the sequence, one or more memory failures shown in the second image appearing after the first image in the sequence;
receiving third data identifying one or more memory failures in the region of the integrated circuit die;
generating, according to the physical layout, a third image showing the one or more memory failures in the region of the integrated circuit die;
analyzing, using the artificial neural network, the third image; and
identifying, based on the analyzing, one or more memory cells in the region, the one or more memory cells identified to have memory failures after a time of the third image.

19. The non-transitory computer readable storage medium of claim 18, wherein pixels representative of the plurality of memory cells in the region are configured to be at locations corresponding to locations of the plurality of memory cells in the region of the integrated circuit die.

20. The non-transitory computer readable storage medium of claim 19, wherein the first data includes health and usage information of the plurality of memory cells in the region; and the pixels representative of the plurality of memory cells in the region are configured to have attributes representative of the health and usage information.

* * * * *